(12) United States Patent
Yamaguchi

(10) Patent No.: US 12,273,070 B2
(45) Date of Patent: Apr. 8, 2025

(54) CIRCUIT DEVICE AND OSCILLATOR

(71) Applicant: SEIKO EPSON CORPORATION, Tokyo (JP)

(72) Inventor: Hisashi Yamaguchi, Fujimi (JP)

(73) Assignee: SEIKO EPSON CORPORATION (JP)

( * ) Notice: Subject to any disclaimer, the term of this patent is extended or adjusted under 35 U.S.C. 154(b) by 22 days.

(21) Appl. No.: 18/497,080

(22) Filed: Oct. 30, 2023

(65) Prior Publication Data

US 2024/0146245 A1 May 2, 2024

(30) Foreign Application Priority Data

Oct. 31, 2022 (JP) .................... 2022-174167

(51) Int. Cl.
*H03B 5/36* (2006.01)
*H03B 5/04* (2006.01)

(52) U.S. Cl.
CPC ............... *H03B 5/36* (2013.01); *H03B 5/04* (2013.01)

(58) Field of Classification Search
CPC ....................................................... H03B 5/36
USPC ........................................................ 331/66
See application file for complete search history.

(56) References Cited

U.S. PATENT DOCUMENTS

| 2014/0070851 | A1* | 3/2014 | Iwabuchi | H03K 3/01 327/108 |
|---|---|---|---|---|
| 2017/0371389 | A1 | 12/2017 | Kawasoe | |
| 2019/0326855 | A1* | 10/2019 | Uno | H03L 1/025 |
| 2019/0369560 | A1 | 12/2019 | Yamazaki | |

FOREIGN PATENT DOCUMENTS

| JP | 2003-345473 A | 12/2003 |
|---|---|---|
| JP | 2018-007339 A | 1/2018 |
| JP | 2019-211465 A | 12/2019 |

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit, a control circuit, a first power supply line, a second power supply line, a nonvolatile memory, a volatile memory, and a power supply switch circuit. The oscillation circuit generates a clock signal by oscillating a resonator. The control circuit performs a real-time clock process based on the clock signal. The nonvolatile memory operates at a first power supply voltage from the first power supply line. The volatile memory operates at a second power supply voltage from the second power supply line. The power supply switch circuit performs control of switching between supply and non-supply of the first power supply voltage to the first power supply line and control of switching between supply and non-supply of the second power supply voltage to the second power supply line.

14 Claims, 9 Drawing Sheets

CIRCUIT DEVICE AND OSCILLATOR

The present application is based on, and claims priority from JP Application Serial Number 2022-174167, filed Oct. 31, 2022, the disclosure of which is hereby incorporated by reference herein in its entirety.

BACKGROUND

1. Technical Field

The present disclosure relates to a circuit device, an oscillator, and the like.

2. Related Art

A circuit device including a normally operating module such as a real-time clock is known. JP-A-2018-007339 discloses a method of stopping supply of an internal power supply voltage to a circuit including various memories in order to reduce power consumption when a voltage level of an external power supply voltage is equal to or less than a predetermined threshold value.

JP-A-2018-007339 discloses a power supply control method limited to a situation in which the external power supply voltage decreases, but does not disclose a method of performing appropriate power supply control on a nonvolatile memory and a volatile memory.

SUMMARY

An aspect of the present disclosure relates to a circuit device including: an oscillation circuit configured to generate a clock signal by oscillating a resonator; a control circuit configured to perform a real-time clock process based on the clock signal; a first power supply line; a second power supply line; a nonvolatile memory configured to operate at a first power supply voltage from the first power supply line; a volatile memory configured to operate at a second power supply voltage from the second power supply line; and a power supply switch circuit configured to perform control of switching between supply and non-supply of the first power supply voltage to the first power supply line and control of switching between supply and non-supply of the second power supply voltage to the second power supply line.

Another aspect of the present disclosure relates to an oscillator including the above-described circuit device and a resonator.

DESCRIPTION OF EMBODIMENTS

Hereinafter, a preferred embodiment according to the present disclosure will be described in detail. The embodiment to be described below does not unduly limit contents described in claims, and not all configurations described in the embodiment are necessarily essential constituent elements.

Figure 1:
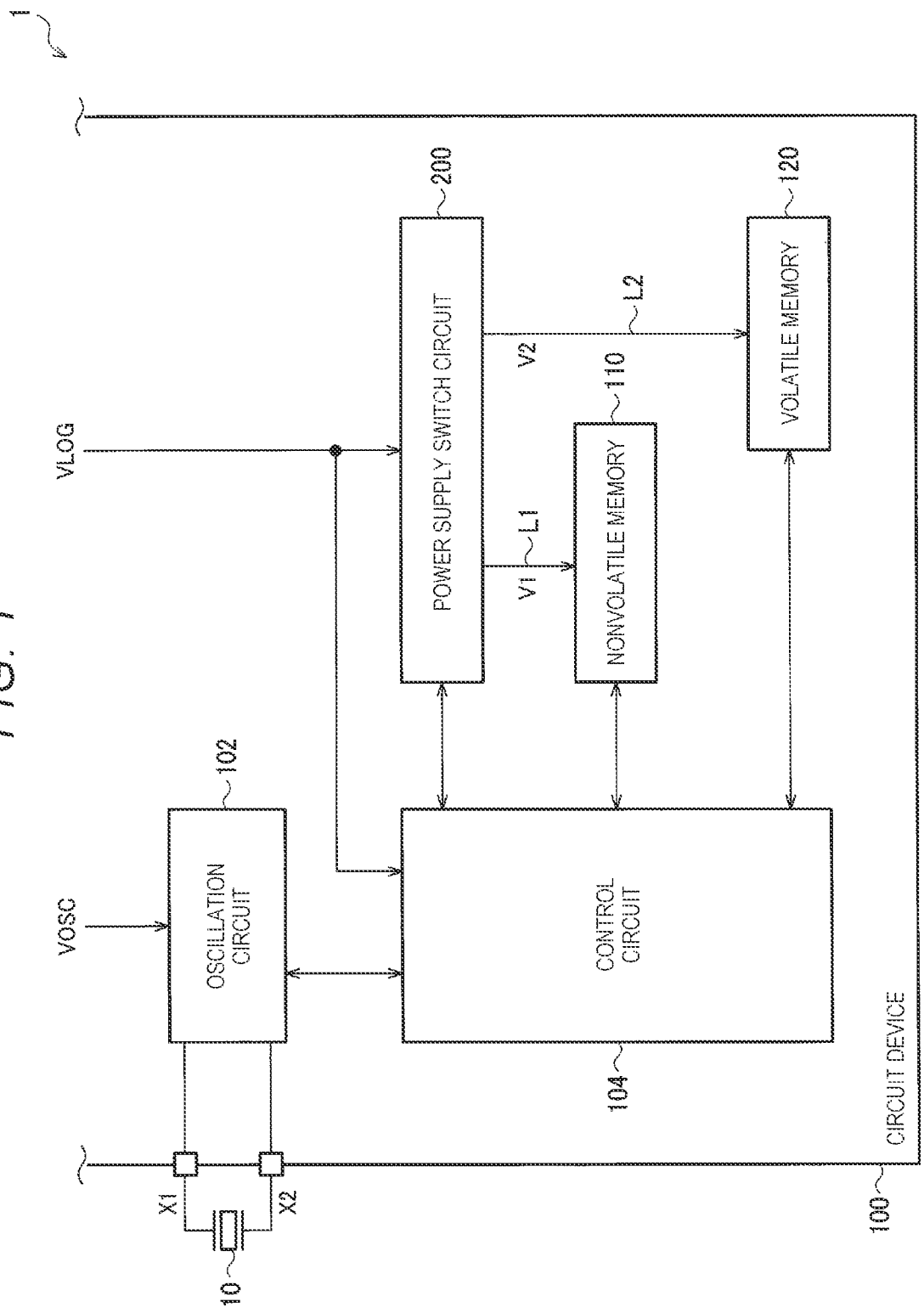
FIG. 1 is a diagram showing a configuration example of an oscillator including a circuit device.

FIG. 1 is a diagram showing a configuration example of an oscillator 1 according to the embodiment. The oscillator 1 includes a resonator 10 and a circuit device 100. The circuit device 100 includes an oscillation circuit 102, a control circuit 104, a first power supply line L1, a second power supply line L2, a nonvolatile memory 110, a volatile memory 120, and a power supply switch circuit 200. The circuit device 100 according to the embodiment is not limited to the example of FIG. 1, and modifications such as adding other configurations can be implemented. The other configuration is, for example, a power supply circuit 130 to be described later with reference to FIG. 3 and a temperature compensated circuit 140 to be described later with reference to FIG. 5, but the other configuration may be not limited thereto, and may be a power-on reset circuit or the like.

The resonator 10 generates mechanical vibration according to an electric signal. The resonator 10 can be implemented by a resonator element such as a quartz crystal resonator element. For example, the resonator 10 can be implemented by a quartz crystal resonator element whose cut angle is an AT cut or an SC cut and performs thickness-shear vibration. As the quartz crystal resonator element, a tuning fork type quartz crystal resonator element, a double tuning fork type quartz crystal resonator element, or the like can be adopted. The resonator 10 according to the embodiment can be implemented by various resonator elements such as a resonator element other than a thickness-shear resonating type resonator element, and a piezoelectric resonator element formed of a material other than quartz crystal. For example, a surface acoustic wave (SAW) resonator may be adopted as the resonator 10, and the resonator 10 may be formed of a micro electro mechanical systems (MEMS) using a silicon substrate. For example, the resonator 10 may be a resonator built in a temperature compensated quartz crystal oscillator (TCXO) including no thermostatic oven or may be a resonator built in an oven-controlled quartz crystal oscillator (OCXO) including a thermostatic oven.

The oscillation circuit 102 oscillates the resonator 10 described above. For example, the oscillation circuit 102 can be implemented by a transistor such as a bipolar transistor that implements a drive circuit, and an active element such as a capacitor or a resistor. As the oscillation circuit 102, various types of oscillation circuits such as a Pierce type, a Colpitts type, an inverter type, or a Hartley type can be adopted. The oscillation circuit 102 operates according to, for example, a voltage VOSC supplied from the power supply circuit 130 (not shown in FIG. 1).

The oscillation circuit 102 is electrically coupled to a terminal X1 and a terminal X2, and generates an oscillation signal by oscillating the resonator 10. Specifically, for example, the oscillation circuit 102 includes a drive circuit (not shown) and the like, drives the resonator 10 via signal lines coupled to the terminal X1 and the terminal X2, and oscillates the resonator 10. Accordingly, a clock signal having a predetermined frequency such as 32.768 kHz is generated and outputs to the control circuit 104 to be described later. The oscillation circuit 102 may further include a variable capacitance circuit (not shown). Accordingly, a capacitance of the variable capacitance circuit can be adjusted. Accordingly, an oscillation frequency can be adjusted.

The control circuit 104 operates according to a voltage VLOG supplied from the power supply circuit 130 (not shown in FIG. 1), and controls each unit of the circuit device 100 by, for example, a processor to be described later. The control circuit 104 includes, for example, a clock circuit (not shown), generates clock data representing a time in seconds, clock data representing a time in years, and the like based on the clock signal received from the oscillation circuit 102 to be described above, and outputs these pieces of clock data to an external device or the like via an external interface (not shown). That is, the circuit device 100 according to the embodiment is a circuit that functions as a real-time clock, and the control circuit 104 performs a real-time clock process based on the clock signal from the oscillation circuit 102.

The nonvolatile memory 110 operates at a first power supply voltage V1 from the first power supply line L1 to be described later. The nonvolatile memory 110 is, for example, a flash memory including a metal oxide nitride oxide silicon (MONOS) memory cell, but may be an electrically erasable programmable read only memory (EEPROM) including a floating gate memory cell. The nonvolatile memory 110 stores predetermined data and the like. The predetermined data and the like will be described in detail later. Although not shown, the circuit device 100 may further include a terminal and an interface circuit for writing the predetermined data and the like to the nonvolatile memory 110.

The volatile memory 120 operates at a second power supply voltage V2 from a second power supply line L2 to be described later. The volatile memory 120 is, for example, a static random access memory (SRAM), but may be a dynamic random access memory (DRAM), and can be appropriately selected according to the purpose or the like. For example, when a large capacitance is required, the DRAM may be selected as the volatile memory 120, and when power consumption reduction is required, the SRAM may be selected as the volatile memory 120.

As described above, the circuit device 100 according to the embodiment includes the nonvolatile memory 110 and the volatile memory 120, so that the control circuit 104 can execute a predetermined process. Specifically, for example, when the supply of the voltage VLOG to the control circuit 104 is started, the processor reads a boot program stored in the nonvolatile memory 110 and copies various types of data stored in the nonvolatile memory 110 to the volatile memory 120. Thereafter, a processor 201 can execute the predetermined process by sequentially executing a command code which is the data copied to the volatile memory 120. The predetermined process is, for example, a process related to a function other than the above-described real-time clock function, and will be described in detail later. The processor according to the embodiment is, for example, a central processing unit (CPU), but may be a hardware circuit including a graphic processing unit (GPU), a digital signal processor (DSP), and an ASIC. The processor according to the embodiment may include an amplifier circuit, a filter circuit, and the like which process analog signals. In the following description, the CPU is exemplified as a processor which mainly performs processing according to a method of the embodiment.

In FIG. 1, the nonvolatile memory 110 and the volatile memory 120 are illustrated outside the control circuit 104, but the illustration is for convenience only, and the nonvolatile memory 110 and the volatile memory 120 may be included in the control circuit 104. The same applies to FIG. 3.

The power supply switch circuit 200 operates at the voltage VLOG described above and is coupled to the first power supply line L1 and the second power supply line L2. Accordingly, the first power supply voltage V1 can be supplied to the nonvolatile memory 110, and the second power supply voltage V2 can be supplied to the volatile memory 120.

A voltage value of the second power supply voltage V2 may be the same as or different from a voltage value of the first power supply voltage V1. For example, the power supply switch circuit 200 may output the voltage VLOG to the first power supply line L1 as the first power supply voltage V1, and may output the voltage VLOG to the second power supply line L2 as the second power supply voltage V2. In this case, the voltage value of the second power supply voltage V2 is the same as the voltage value of the first power supply voltage V1. In addition, for example, the power supply switch circuit 200 may output a voltage obtained by regulating the voltage VLOG as the first power supply voltage V1 to the first power supply line L1, and may separately output a voltage obtained by regulating the voltage VLOG as the second power supply voltage V2 to the second power supply line L2. In this case, the voltage value of the second power supply voltage V2 is different from the voltage value of the first power supply voltage V1. FIG. 1 shows that the voltage VLOG is supplied to the power supply switch circuit 200 from the same power supply line as the power supply line supplied to the control circuit 104, but the present disclosure is not limited thereto, and the power supply lines coupled to the control circuit 104 and the power supply switch circuit 200 may be different.

The power supply switch circuit 200 performs control of switching between supply and non-supply of the first power supply voltage V1 to the first power supply line L1 and control of switching between supply and non-supply of the second power supply voltage V2 to the second power supply line L2. For example, the power supply switch circuit 200 can switch between the supply and the non-supply of the first power supply voltage V1 and the second power supply voltage V2 based on a control signal from the CPU of the control circuit 104 as described later, but may switch between the supply and the non-supply of the first power supply voltage V1 and the second power supply voltage V2 based on a control signal from a processor of an external device (not shown). In addition, for example, the control of switching between the supply and the non-supply of the first power supply voltage V1 and the second power supply voltage V2 may be performed by a manual operation of a user when the power supply switch circuit 200 is coupled to an operation unit (not shown). The control of switching between the supply and the non-supply of the first power supply voltage V1 to the first power supply line L1 and the control of switching between the supply and the non-supply of the second power supply voltage V2 to the second power supply line L2 may be performed independently.

As described above, the circuit device 100 according to the embodiment includes the oscillation circuit 102, the control circuit 104, the first power supply line L1, the second power supply line L2, the nonvolatile memory 110, the volatile memory 120, and the power supply switch circuit 200. The oscillation circuit 102 generates the clock signal by oscillating the resonator 10. The control circuit 104 performs the real-time clock process based on the clock signal. The nonvolatile memory 110 operates at the first power supply voltage V1 from the first power supply line L1. The volatile memory 120 operates at the second power supply voltage V2 from the second power supply line L2. The power supply switch circuit 200 performs the control of switching between the supply and the non-supply of the first power supply voltage V1 to the first power supply line L1 and the control of switching between the supply and the non-supply of the second power supply voltage V2 to the second power supply line L2.

As described above, the circuit device 100 according to the embodiment includes the oscillation circuit 102 and the control circuit 104, and thus, the circuit device 100 can function as the real-time clock. Since the circuit device 100 includes the nonvolatile memory 110, the volatile memory 120, the first power supply line L1, and the second power supply line L2, the first power supply voltage V1 can be supplied to the nonvolatile memory 110, and the second power supply voltage V2 can be supplied to the volatile memory 120. Accordingly, the CPU or the like included in the control circuit 104 can perform a process using a predetermined program. The circuit device 100 includes the power supply switch circuit 200, and thus, it is possible to perform the control of switching between the supply and the non-supply of the first power supply voltage V1 to the first power supply line L1 and the control of switching between the supply and the non-supply of the second power supply voltage V2 to the second power supply line L2. Accordingly, it is possible to perform appropriate power supply control on the nonvolatile memory 110 and the volatile memory 120. For example, in a device in which the circuit device 100 is incorporated, the supply and the non-supply to the first power supply line L1 and the second power supply line L2 can be switched, and thus convenience of the device can be improved. For example, when an upper limit of a power consumption amount of the device is determined, a module to which a voltage can be supplied is limited. In such a situation, for example, when the voltage supply to the nonvolatile memory 110 is not necessary, and the voltage to the first power supply line L1 can be set to the non-supply, the voltage can be supplied to another module to cause the corresponding module to function. In the circuit device 100 according to the embodiment, since the power supply switch circuit 200 is used, the power supply control for the nonvolatile memory 110 and the volatile memory 120 can be performed in various situations, but such a method is not proposed.

The method according to the embodiment may be implemented in the oscillator 1. That is, the oscillator 1 according to the embodiment includes the above-described circuit device 100 and the resonator 10. In this manner, similar effects as above can be obtained.

The method according to the embodiment is not limited to the above, and various modifications can be made. For example, the power supply switch circuit 200 may provide a state where the supply of the first power supply voltage V1 to the first power supply line L1 and the supply of the second power supply voltage V2 to the second power supply line L2 are continued. In addition, the power supply switch circuit 200 may provide a state where the non-supply of the first power supply voltage V1 to the first power supply line L1 and the supply of the second power supply voltage V2 to the second power supply line L2 are continued. In addition, the power supply switch circuit 200 may provide a state where the non-supply of the first power supply voltage V1 to the first power supply line L1 and the non-supply of the second power supply voltage V2 to the second power supply line L2 are continued.

Figure 2:
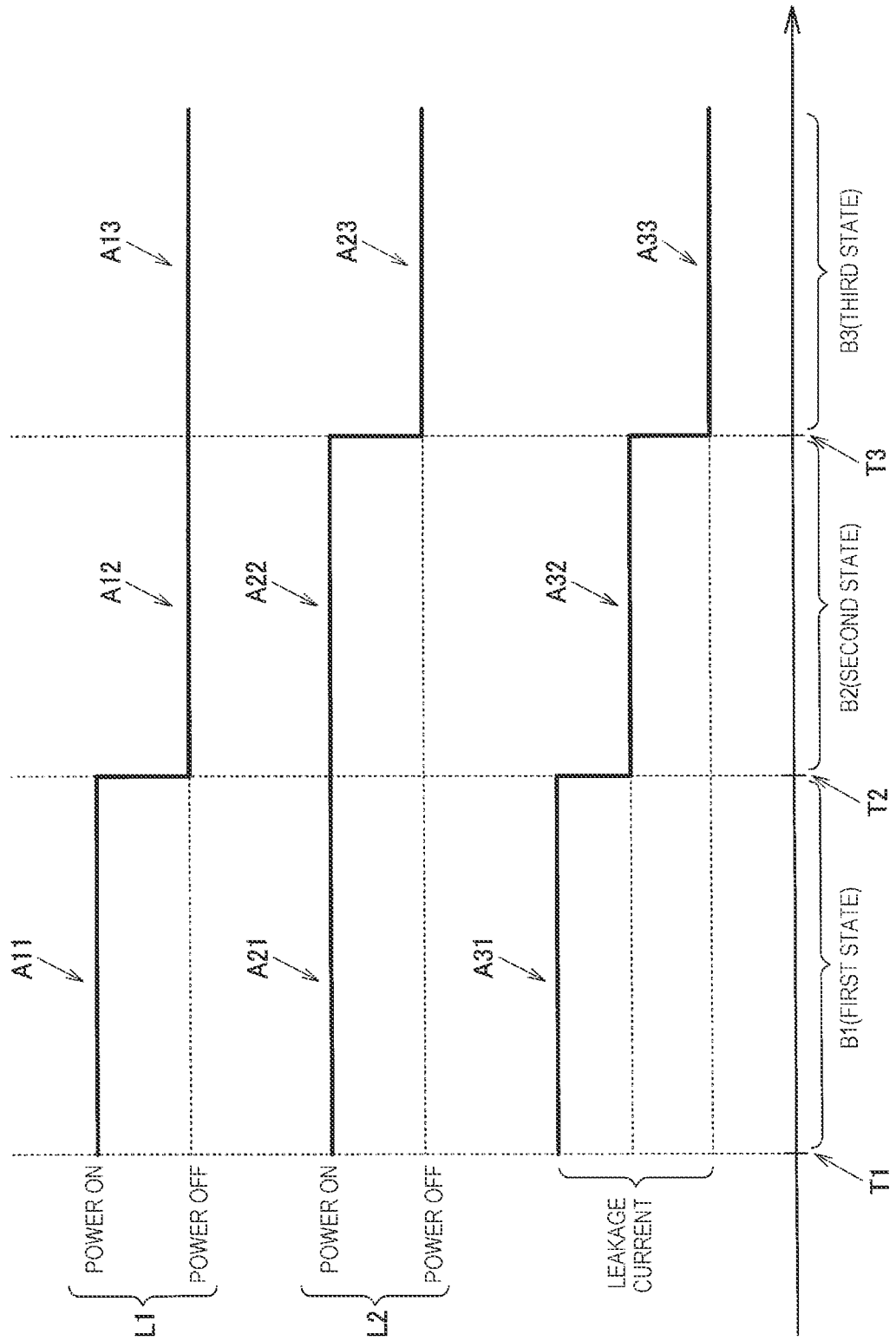
FIG. 2 is a timing chart showing a first state, a second state, and a third state.

For example, as shown in a timing chart of FIG. 2, the circuit device 100 according to the embodiment can transition from a first state indicated by B1 to a second state indicated by B2 or can transition to a third state indicated by B3 as time elapses. Specifically, in FIG. 2, between a timing T1 and a timing T2, the first power supply line L1 is in a power-on state as indicated by A11, and the second power supply line L2 is in a power-on state as indicated by A21. In the embodiment, a state where the first power supply line L1 is in the state of A11 and the second power supply line L2 is in the state of A21 is referred to as the first state.

In FIG. 2, between the timing T2 and a timing T3, the first power supply line L1 is in a power-off state as indicated by A12, and the second power supply line L2 is in the power-on state as indicated by A22. For example, at the timing T2, the supply of the first power supply voltage V1 to the first power supply line L1 can be switched to the non-supply according to the control signal from the CPU of the external device described above. In the embodiment, a state where the first power supply line L1 is in the state of A12 and the second power supply line L2 is in the state of A22 is referred to as the second state.

After the timing T3 in FIG. 2, the first power supply line L1 is in the power-off state as indicated by A13, and the second power supply line L2 is in the power-off state as indicated by A23. For example, at the timing T3, the supply of the second power supply voltage V2 to the second power supply line L2 can be switched to the non-supply according to the control signal from the CPU of the external device described above. In the embodiment, a state where the first power supply line L1 is in the state of A13 and the second power supply line L2 is in the state of A23 is referred to as the third state.

As described above, in the circuit device 100 according to the embodiment, in the first state, the power supply switch circuit 200 supplies the first power supply voltage V1 to the first power supply line L1 and supplies the second power supply voltage V2 to the second power supply line L2. In the second state, the power supply switch circuit 200 does not supply the first power supply voltage V1 to the first power supply line L1 and supplies the second power supply voltage V2 to the second power supply line L2. In the third state, the power supply switch circuit 200 does not supply the first power supply voltage V1 to the first power supply line L1 and does not supply the second power supply voltage V2 to the second power supply line L2. In this manner, a magnitude of a leakage current can be changed according to a desired state.

For example, in the first state shown in B1 of FIG. 2, since the first power supply voltage V1 is supplied to the nonvolatile memory 110 and the second power supply voltage V2 is supplied to the volatile memory 120, for example, a leakage current having a magnitude indicated by A31 is generated in the circuit device 100. The leakage current is a current generated even when the module is coupled to the power supply and does not operate, and may be referred to as a standby current. When the leakage current is large, extra power consumption generated in the circuit device 100 is large. In the second state indicated by B2 in FIG. 2, the second power supply voltage V2 is supplied to the volatile memory 120, but the first power supply voltage V1 is not supplied to the nonvolatile memory 110, and thus, for example, as indicated by A32, a leakage current having a magnitude smaller than the magnitude indicated by A31 is generated in the circuit device 100. Further, in the third state indicated by B3 in FIG. 2, since the second power supply voltage V2 is no longer supplied to the volatile memory 120, for example, as indicated by A33, a leakage current having a magnitude smaller than the magnitude indicated by A32 is generated in the circuit device 100. In other words, the extra power consumption generated in the circuit device 100 decreases in the order of the first state, the second state, and the third state.

The above is an example in which the power supply switch circuit 200 is controlled according to the control signal from the external device to transition from the first state to the second state and transition from the second state to the third state, but the method according to the embodiment is not limited thereto, and the CPU of the control circuit 104 may control the power supply switch circuit 200 in a programmable manner to transition from the first state to the second state and transition from the second state to the third state. In this case, for example, a program related to the process of FIG. 2 may be a program of the predetermined process described above. That is, program data related to the process of FIG. 2 is stored in the nonvolatile memory 110 as the predetermined data described above, and the CPU of the control circuit 104 executes the program using the volatile memory 120 as a working memory, so that programmable control of the power supply switch circuit 200 can be implemented. As described above, in the circuit device 100 according to the embodiment, the volatile memory 120 stores the program data for operating the control circuit 104. In this manner, the control circuit 104 can control the power supply switch circuit 200 in a programmable manner.

In addition, for example, in the program of FIG. 2, control of transitioning from the third state to the first state may be added. Specifically, for example, the third state is a sleep state of the CPU. The sleep state is a state in which the second power supply voltage V2 is not supplied to the volatile memory 120 and the program cannot be executed. Although illustration and the like are omitted, a process of activating the CPU in the sleep state and a process of starting the execution of the program again at a timing when the CPU is activated from the sleep state may be added. The process of activating the CPU in the sleep state can be implemented by various interrupt processes such as a timer interrupt. As described above, in the circuit device 100 according to the embodiment, the power supply switch circuit 200 is set to the third state during a sleep operation period of the circuit device 100. In this manner, a period during which the control circuit 104 is operated and the sleep operation period can be freely set. Accordingly, the power consumption of the circuit device 100 can be appropriately reduced.

Figure 3:
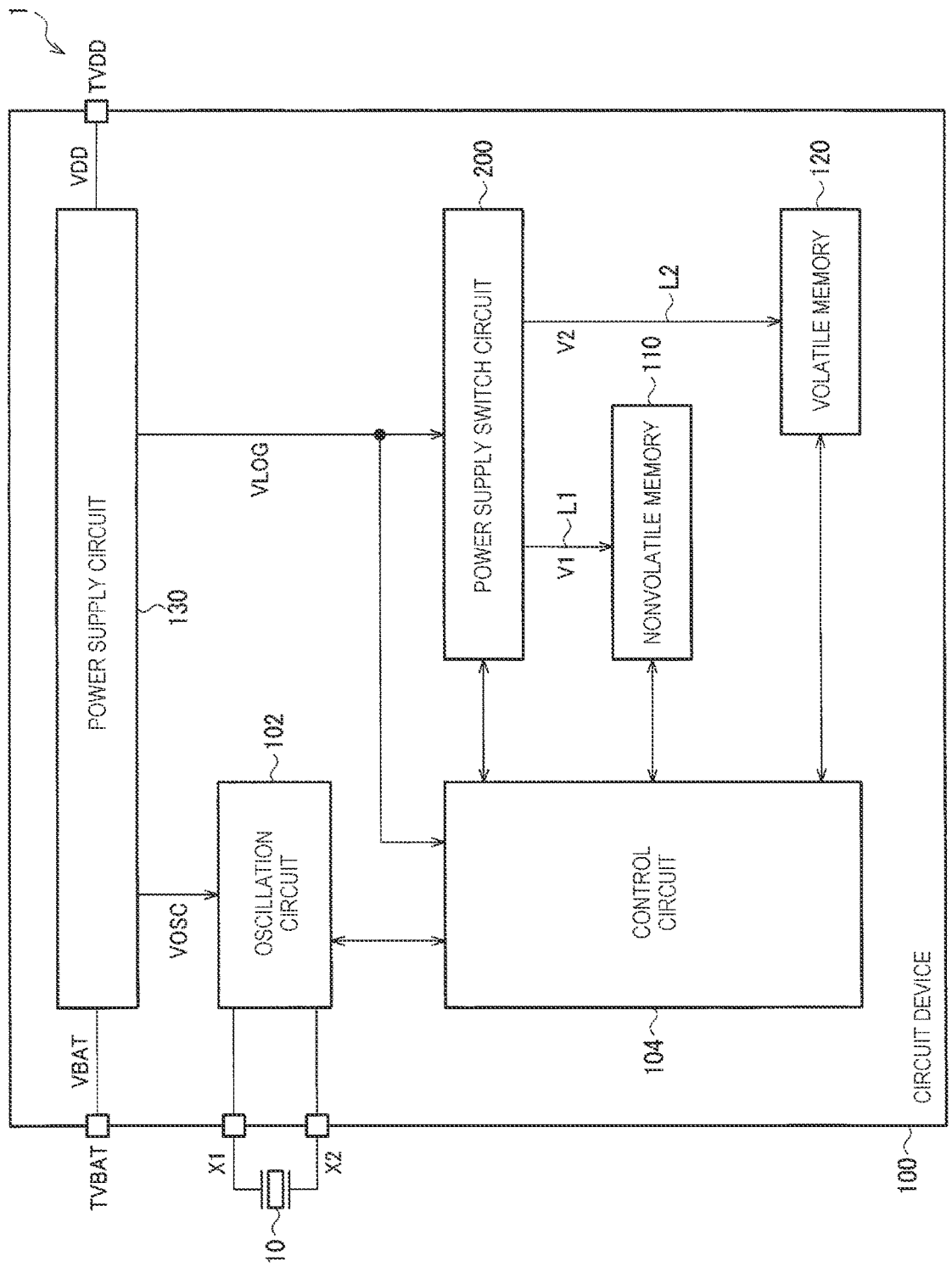
FIG. 3 is a diagram showing a more detailed configuration example of the oscillator including the circuit device.

In addition, the oscillator 1 including the circuit device 100 according to the embodiment may have, for example, a configuration example shown in FIG. 3. The example of FIG. 3 further includes the power supply circuit 130, a terminal TVDD, and a terminal TVBAT as compared with the example of FIG. 1. The terminal TVDD is coupled to, for example, an external power supply, and a voltage VDD is supplied from the external power supply. A battery is coupled to the terminal TVBAT, and a voltage VBAT is supplied from the battery. The battery may be a primary battery or a secondary battery, and functions as a backup power supply when the voltage VDD is not supplied. The power supply circuit 130 monitors the voltage VDD and the voltage VBAT, switches the voltage VDD and the voltage VBAT based on a monitoring result, and generates and outputs the voltage VOSC, the voltage VLOG, and the like described above through a regulator (not shown) or the like.

In the circuit device 100 as shown in FIG. 3, for example, the power supply circuit 130 may transmit a signal related to the above monitoring result to the control circuit 104. The control circuit 104 may perform a sleep operation at a timing at which the voltage VDD is switched to the voltage VBAT based on the signal. In this manner, the circuit device 100 can perform an operation of reducing the power consumption at a timing when the voltage VLOG is supplied based on the voltage VBAT, for example. Accordingly, a life of the battery can be extended.

Figure 4:
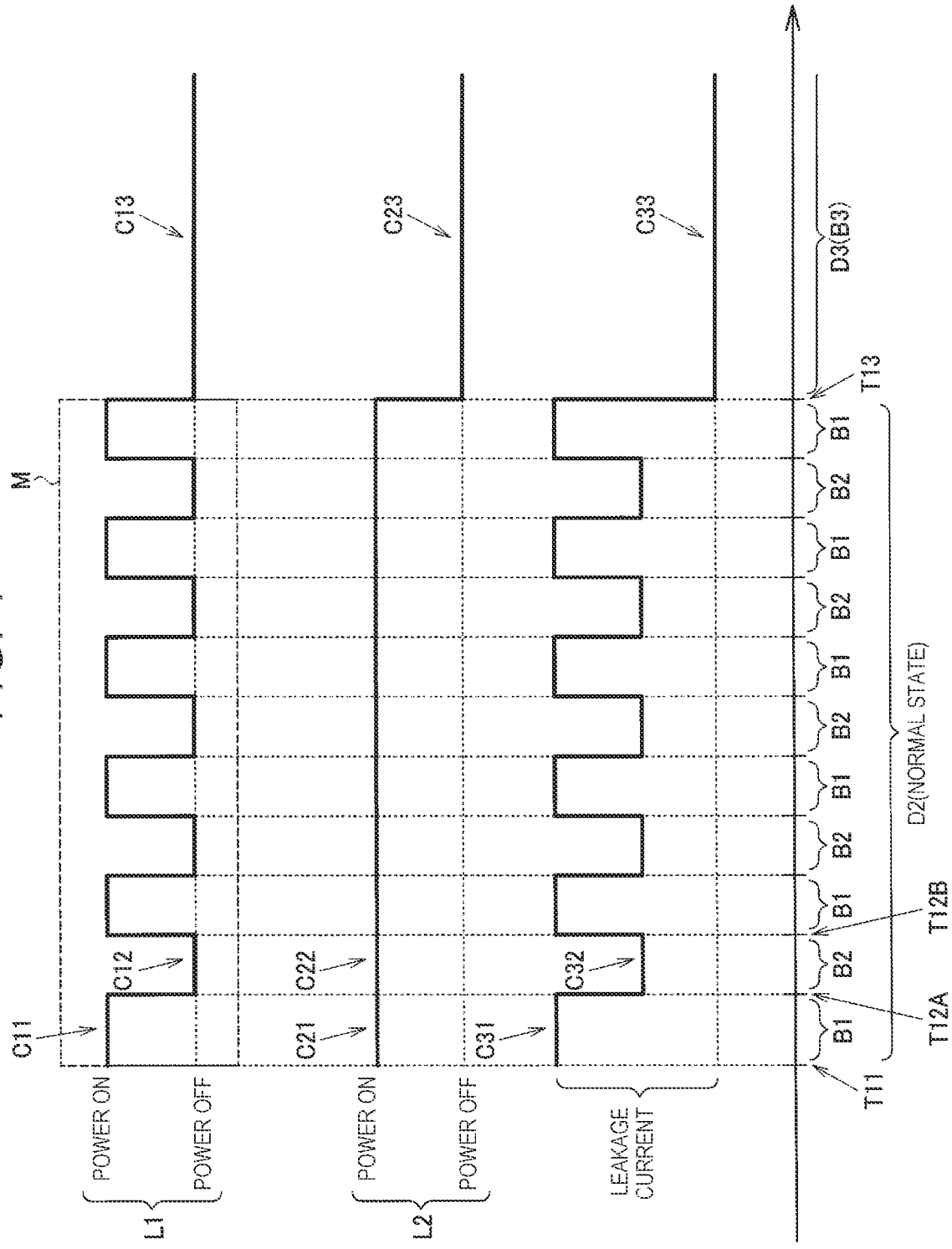
FIG. 4 is a diagram showing an intermittent operation in a normal state.

In addition, although FIG. 2 shows an example of the control of transitioning from the second state to the third state, control of transitioning from the second state to the first state again may be performed as an example, or control of repeating the transition between the first state and the second state may be performed as an example. For example, as shown in FIG. 4, between a timing T11 and a timing T12A, the first power supply line L1 is in the power-on state as indicated by C11, and the second power supply line L2 is in the power-on state as indicated by C21. That is, similarly to B1 in FIG. 2, the state of the circuit device 100 is the first state between the timing T11 and the timing T12A in FIG. 4. Similarly to B2 of FIG. 2, the circuit device 100 is in the second state between the timing T12A and a timing T12B. That is, the first power supply line L1 is in the power-off state as indicated by C12, and the second power supply line L2 is in the power-on state as indicated by C22. Thereafter, the circuit device 100 alternately repeats the first state indicated by B1 and the second state indicated by B2. Accordingly, the power supply of the first power supply line L1 is subjected to an intermittent operation as indicated by M in FIG. 4. In the following description, the intermittent operation performed on the power supply of the first power supply line L1 as indicated by M in FIG. 4 may be simply referred to as the intermittent operation.

In other words, in the embodiment, when the circuit device 100 alternately repeats the first state and the second state, it can be said that the circuit device 100 performs the intermittent operation.

In this manner, the generated leakage current also exhibits an intermittent behavior. Specifically, similarly to A31 in FIG. 2, a leakage current having a magnitude indicated by C31 is generated between the timing T11 and the timing T12A. In addition, similarly to A32 in FIG. 2, a leakage current having a magnitude indicated by C32 is generated between the timing T12A and the timing T12B. That is, the magnitude of the leakage current indicated by C32 is smaller than the magnitude of the leakage current indicated by C31.

When the example of FIG. 2 is compared with the example of FIG. 4, it is understood that a magnitude of the entire leakage current generated in the example of FIG. 4 is smaller than a magnitude of the entire leakage current generated in the example of FIG. 2. As described above, in the circuit device 100 according to the embodiment, the power supply switch circuit 200 performs the intermittent operation on the supply of the first power supply voltage V1 to the first power supply line L1 by alternately switching between the first state and the second state. In this manner, the nonvolatile memory 110 can be operated only in a desired period. Accordingly, it is possible to prevent an occurrence of excessive power consumption while appropriately operating the circuit device 100. For example, the various programs executed by the circuit device 100 may include a program in which the first power supply voltage V1 does not need to be normally supplied to the nonvolatile memory 110. For example, it is assumed that there is a program in which the first power supply voltage V1 needs to be supplied to the nonvolatile memory 110 only during a period in which the CPU of the control circuit 104 accesses the nonvolatile memory 110. When such a program is executed, by turning on and off the power supply to the first power supply line L1 as indicated by M in FIG. 4, it is possible to prevent the occurrence of excessive power consumption, and to operate the program normally.

It is assumed that a cycle or the like of the intermittent operation indicated by M in FIG. 4 can be appropriately set by the user according to a specification or the like of the program. That is, in the embodiment, it is assumed that the program operates normally even when the intermittent operation indicated by M in FIG. 4 is performed. In the following description, a state where the above-described intermittent operation is performed may be referred to as a normal state. For example, in FIG. 4, a period indicated by D2 is a period of the normal state, and a period indicated by D3 is a period of the sleep state similarly to B3 of FIG. 2.

Figure 5:
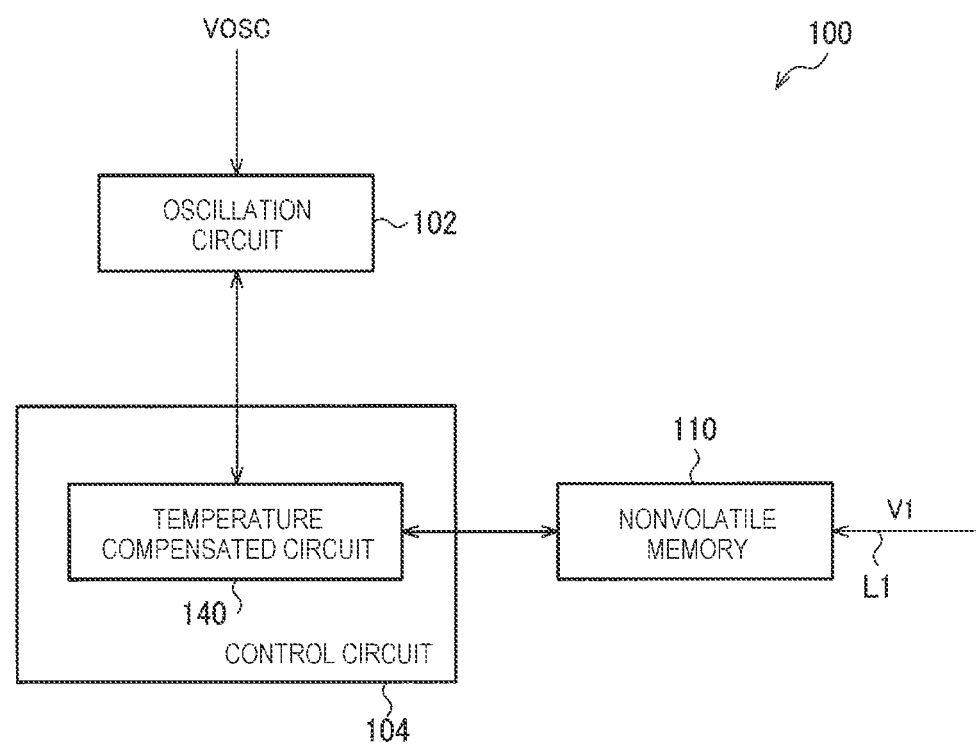
FIG. 5 is a diagram showing the circuit device including a temperature compensated circuit.

As shown in FIG. 5, the circuit device 100 according to the embodiment may further include the temperature compensated circuit 140. The temperature compensated circuit 140 performs temperature compensation on the resonator 10. The temperature compensation refers to performing control to reduce variation in oscillation frequency caused by temperature variation of the resonator 10, and an example of a specific method will be described later. In the circuit device 100 of FIG. 5, configurations other than the oscillation circuit 102, the control circuit 104, the nonvolatile memory 110, the temperature compensated circuit 140, and the first power supply line L1 are appropriately omitted. The control circuit 104 includes the temperature compensated circuit 140 in FIG. 5, but is merely an example, the control circuit 104 and the temperature compensated circuit 140 may be separately provided, and various configuration examples can be made based on a known method.

The temperature compensated circuit 140 generates temperature compensation data for making the oscillation frequency of the oscillation circuit 102 constant regardless of temperatures based on temperature detection data received from a temperature detection circuit (not shown), and outputs the temperature compensation data to the variable capacitance circuit (not shown) in the oscillation circuit 102. The temperature detection circuit includes, for example, a temperature sensor (not shown) and an A/D conversion circuit (not shown). The temperature sensor utilizes, for example, temperature dependence of a forward voltage of a PN junction of a base-emitter voltage of the bipolar transistor, and outputs a temperature-dependent voltage that changes according to a temperature of an environment of the resonator 10 to the A/D conversion circuit as an analog temperature detection voltage. The A/D conversion circuit performs A/D conversion on the received analog temperature detection voltage by a successive approximation method or the like, and outputs digital temperature detection data to the temperature compensated circuit 140. Alternatively, the temperature detection circuit may include, for example, a ring oscillator and a counter (not shown). For example, the counter may count an output pulse signal, which is an oscillation signal of the ring oscillator, in a count period defined by the clock signal based on the oscillation signal of the oscillation circuit 102 using a property that the oscillation frequency of the ring oscillator has the temperature dependence, and output a count value as the temperature detection data to the temperature compensated circuit 140.

The nonvolatile memory 110 stores a look-up table in which an address corresponding to the above temperature detection data and the temperature compensation data are listed. The temperature compensated circuit 140 selects, from the look-up table, the digital temperature compensation data corresponding to the digital temperature detection data received from the A/D conversion circuit, and outputs the temperature compensation data to the variable capacitance circuit. In order to perform the temperature compensation according to the embodiment in a programmable manner, it is necessary not only to supply the second power supply voltage V2 to the volatile memory 120 but also to operate the nonvolatile memory 110, that is, to supply the first power supply voltage V1 to the nonvolatile memory 110. That is, in the circuit device 100 according to the embodiment, the temperature compensation can be performed in the first state shown in B1 of FIG. 2.

In the circuit device 100 according to the embodiment, it is assumed that a temperature compensation program can be executed in the intermittent operation indicated by M in FIG. 4. That is, a real-time clock device implemented by the oscillator 1 including the circuit device 100 according to the embodiment can perform the real-time clock process based on the temperature-compensated clock signal in the normal state.

The variable capacitance circuit can be implemented by including, for example, a switch array in which a plurality of switches are provided in parallel and a capacitor array in which a plurality of capacitors are provided in parallel. A capacitance of the variable capacitance circuit is adjusted by turning on or off each switch of the switch array based on each bit of the digital temperature compensation data output from the temperature compensated circuit 140. The variable capacitance circuit may be implemented by including a D/A conversion circuit (not shown) and a variable capacitance element such as a varactor (not shown). In this case, the capacitance of the variable capacitance circuit is adjusted by performing D/A conversion of the digital temperature compensation data output from the temperature compensated circuit 140 to generate a control voltage and adjusting the capacitance of the variable capacitance element based on the generated control voltage. As described above, the circuit device 100 according to the embodiment includes the temperature compensated circuit 140 that performs the temperature compensation on the oscillation frequency of the oscillation circuit 102, and the nonvolatile memory 110 stores the temperature compensation information used for the temperature compensation. In this manner, it is possible to obtain a highly accurate oscillation frequency from the resonator 10 while controlling the power consumption.

Figure 6:
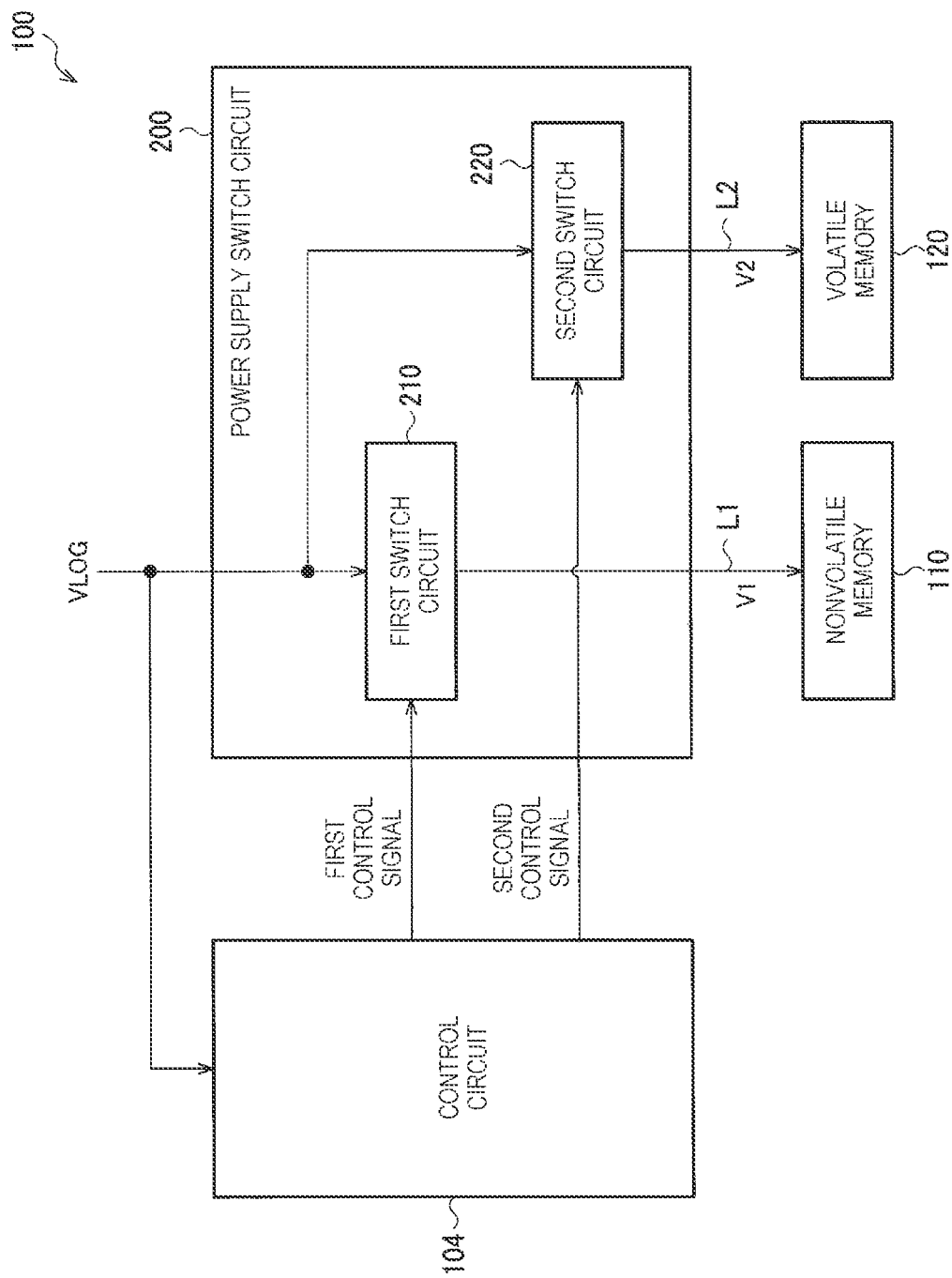
FIG. 6 is a diagram showing a configuration example of a power supply switch circuit.

As shown in FIG. 6, in the circuit device 100 according to the embodiment, the power supply switch circuit 200 may include a first switch circuit 210 and a second switch circuit 220. In the circuit device 100 of FIG. 5, components other than the control circuit 104, the nonvolatile memory 110, the volatile memory 120, the power supply switch circuit 200, the first switch circuit 210, the second switch circuit 220, the first power supply line L1, and the second power supply line L2 are appropriately omitted. By controlling on and off of the first switch circuit 210 and regulating the voltage VLOG to the first power supply voltage V1 by a regulator (not shown), it is possible to control the supply and the non-supply of the first power supply voltage V1 to the nonvolatile memory 110 coupled to the first power supply line L1. Similarly, by controlling on and off of the second switch circuit 220 and regulating the voltage VLOG to the second power supply voltage V2 by the regulator (not shown), it is possible to control the supply and the non-supply of the second power supply voltage V2 to the volatile memory 120 coupled to the second power supply line L2. A specific method for implementing the first switch circuit 210 and the second switch circuit 220 will be described later. As described above, in the circuit device 100 according to the embodiment, the power supply switch circuit 200 includes the first switch circuit 210 that switches between the supply and the non-supply of the first power supply voltage V1 to the first power supply line L1, and the second switch circuit 220 that switches between the supply and the non-supply of the second power supply voltage V2 to the second power supply line L2. In this manner, it is possible to switch between the supply and the non-supply of voltages having different magnitudes to the nonvolatile memory 110 and the volatile memory 120.

Further, as shown in FIG. 6, an input power supply voltage supplied to the power supply switch circuit 200 may be the voltage VLOG which is an input power supply voltage supplied to the control circuit 104. The control circuit 104 may control the first switch circuit 210 and the second switch circuit 220 to be turned on and off by different control signals. In other words, the control circuit 104 may control the first switch circuit 210 according to a first control signal, may control the second switch circuit 220 according to a second control signal, or may separately control the first control signal and the second control signal. As described above, in the circuit device 100 according to the embodiment, the control circuit 104 operates based on the voltage VLOG, which is the input power supply voltage, and independently controls a state where the power supply switch circuit 200 supplies the input power supply voltage to the first power supply line L1 as the first power supply voltage V1 and a state where the power supply switch circuit 200 supplies the input power supply voltage to the second power supply line L2 as the second power supply voltage V2. In this manner, it is possible to supply voltages having different magnitudes to the nonvolatile memory 110 and the volatile memory 120, respectively, and to switch between the supply and the non-supply of voltages to the nonvolatile memory 110 and the volatile memory 120 by the single input power supply voltage.

Figure 7:
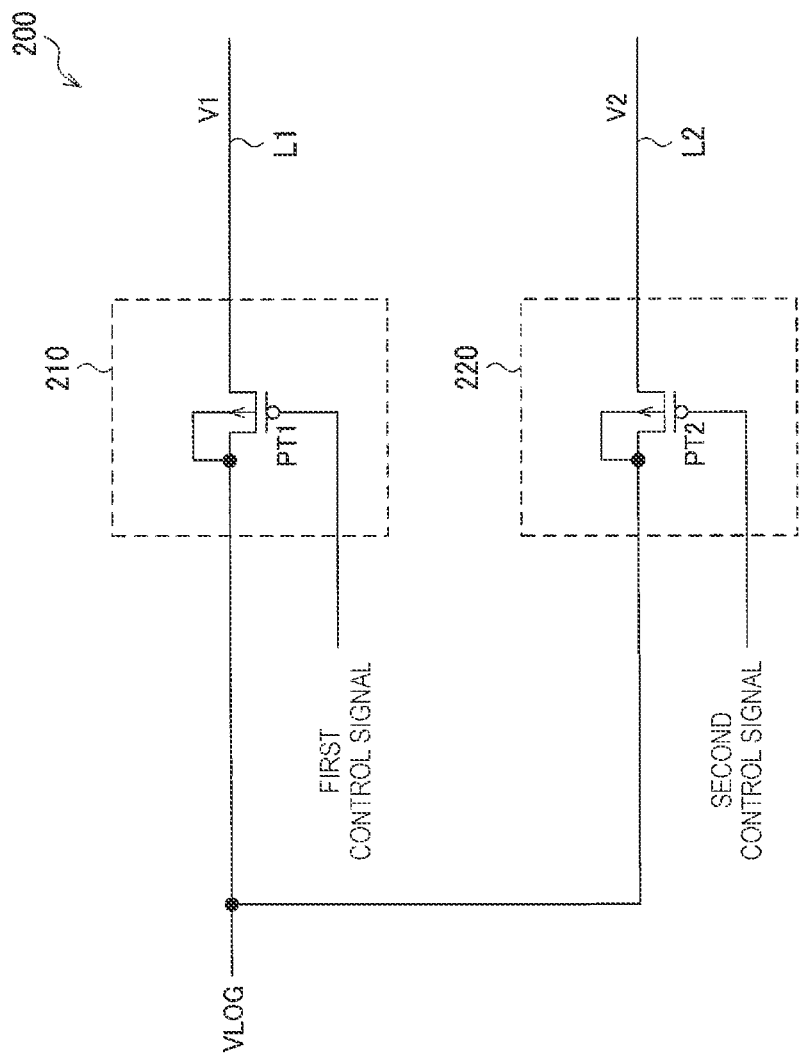
FIG. 7 is a diagram showing a configuration example of a first switch circuit and a second switch circuit.

A specific configuration example of the first switch circuit 210 and the second switch circuit 220 in the power supply switch circuit 200 will be described with reference to FIG. 7. For example, the first switch circuit 210 includes a first P-type transistor PT1. More specifically, for example, a source of the first P-type transistor PT1 is coupled to a node of the voltage VLOG, a drain is coupled to a node of the first power supply voltage V1, a gate is coupled to a node of the first control signal, and a back gate is coupled to the node of the voltage VLOG. As described above, since the first P-type transistor PT1 is provided between the node of the voltage VDD which is the input power supply voltage and the first power supply line L1, the first P-type transistor PT1 can play a role of the first switch circuit 210 by on/off control which will be described later. In this case, the voltage value of the voltage VLOG is equal to the voltage value of the first power supply voltage V1.

Similarly, for example, the second switch circuit 220 includes a second P-type transistor PT2. More specifically, for example, a source of the second P-type transistor PT2 is coupled to a node of the voltage VLOG, a drain is coupled to a node of the second power supply voltage V2, a gate is coupled to a node of the second control signal, and a back gate is coupled to the node of the voltage VLOG. As described above, since the second P-type transistor PT2 is provided between the node of the voltage VLOG, which is the input power supply voltage, and the second power supply line L2, the second P-type transistor PT2 can play a role of the second switch circuit 220 by on/off control which will be described later. In this case, the voltage value of the voltage VLOG is equal to the voltage value of the second power supply voltage V2. As described above, in the circuit device 100 according to the embodiment, the first switch circuit 210 includes the first P-type transistor PT1 that is provided between the node of the input power supply voltage and the first power supply line L1 and is turned on or off based on the first control signal. The second switch circuit 220 includes the second P-type transistor PT2 that is provided between the node of the input power supply voltage and the second power supply line L2 and is turned on or off based on the second control signal. In this manner, it is possible to provide the power supply switch circuit 200 that independently controls the first power supply line L1 and the second power supply line L2 using the P-type transistor.

For example, the control circuit 104 performs control to activate the first control signal. Accordingly, the first P-type transistor PT1 is turned on, and the voltage VLOG is supplied to the nonvolatile memory 110 through the first power supply line L1 as the first power supply voltage V1. Activating the signal means setting the signal to one of a high level and a low level, and deactivating described below the signal means setting the signal to the other level. Similarly, the control circuit 104 performs control to activate the second control signal. Accordingly, the second P-type transistor PT1 is turned on, and the voltage VLOG is supplied to the volatile memory 120 through the second power supply line L2 as the second power supply voltage V2. Accordingly, a degree of freedom of the power supply control to the nonvolatile memory 110 and the volatile memory 120 can be improved.

For example, a regulator (not shown) that regulates the voltage VLOG may be provided, and an output of the regulator may be coupled to a source of the first P-type transistor PT1. In this case, the voltage VLOG is regulated into the first power supply voltage V1 through the regulator (not shown), and the first power supply voltage V1 is supplied to the nonvolatile memory 110 through the first P-type transistor PT1 and the first power supply line L1. Similarly, the output of the regulator that regulates the voltage VLOG to the second power supply voltage V2 may be coupled to a source of the second P-type transistor PT2.

Figure 8:
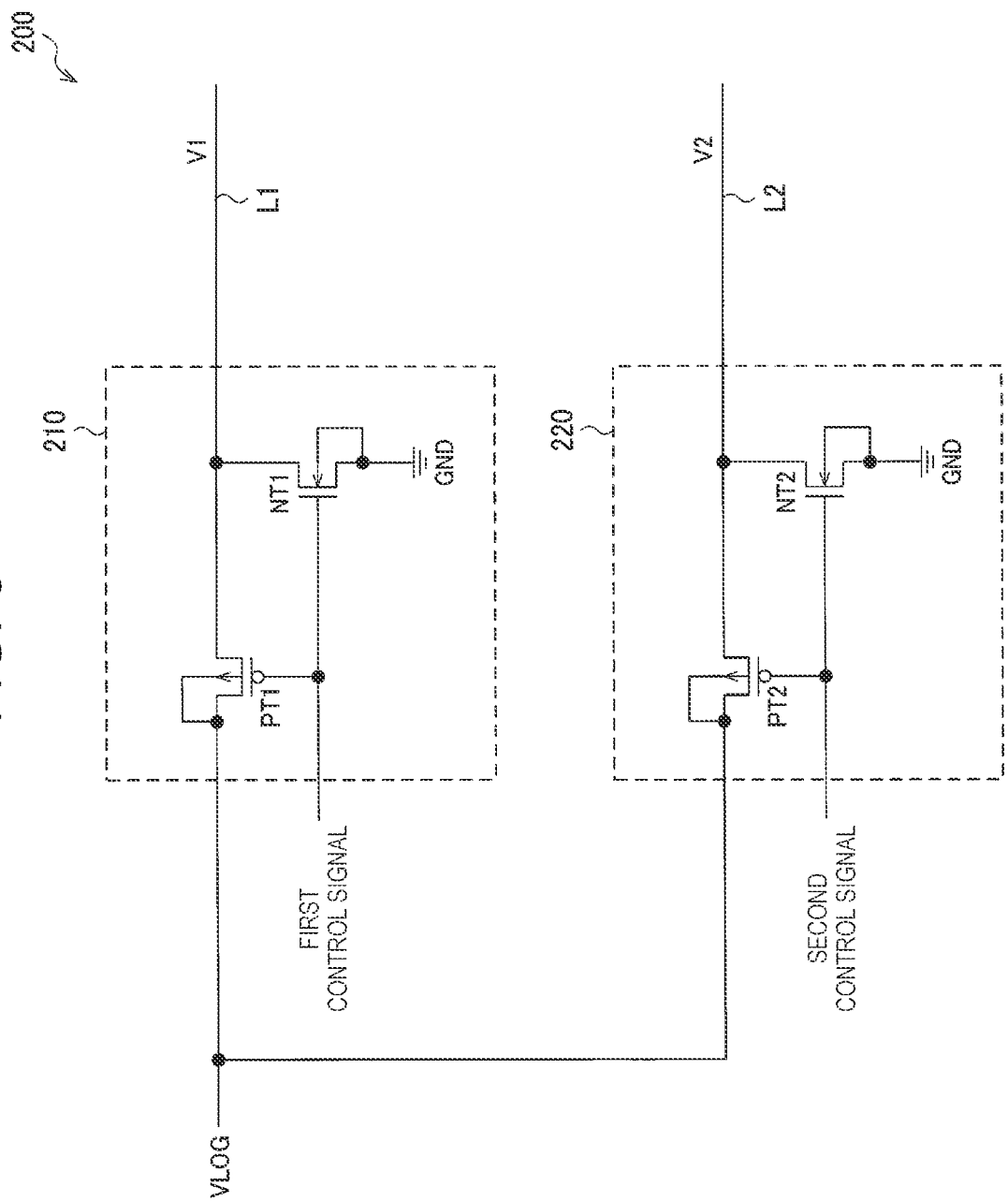
FIG. 8 is a diagram showing a more detailed configuration example of the first switch circuit and the second switch circuit.

As shown in FIG. 8, the first switch circuit 210 may further include, for example, a first N-type transistor NT1. More specifically, for example, a drain of the first N-type transistor NT1 is coupled to the first power supply line L1, a source is coupled to a ground node, a gate is coupled to the node of the first control signal, and a back gate is coupled to the ground node. As described above, the first N-type transistor NT1 is provided between the first power supply line L1 and the ground node. Similarly, the second switch circuit 220 may further include, for example, a second N-type transistor NT2. More specifically, for example, a drain of the second N-type transistor NT2 is coupled to the second power supply line L1, a source is coupled to a ground node, a gate is coupled to the node of the second control signal, and a back gate is coupled to the ground node. As described above, the second N-type transistor NT2 is provided between the second power supply line L2 and the ground node.

For example, when the control circuit 104 activates the first control signal, the first P-type transistor PT1 is turned on and the first N-type transistor NT1 is turned off as described above. On the other hand, when the control circuit 104 deactivates the first control signal, the first P-type transistor PT1 is turned off. Accordingly, the first power supply voltage V1 is not supplied to the nonvolatile memory 110. On the other hand, when the first control signal becomes deactivated, the first N-type transistor NT1 is turned on. Accordingly, an electric charge of the first power supply line L1 is discharged to the ground.

Similarly, when the control circuit 104 activates the second control signal, the second P-type transistor PT2 is turned on, and on the other hand, the second N-type transistor NT2 is turned off as described above. On the other hand, when the control circuit 104 deactivates the second control signal, the second P-type transistor PT2 is turned off. Accordingly, the second power supply voltage V2 is not supplied to the volatile memory 120. On the other hand, when the second control signal is deactivated, the second N-type transistor NT2 is turned on. Accordingly, an electric charge of the second power supply line L2 is discharged to the ground. As described above, in the circuit device 100 according to the embodiment, the first P-type transistor PT1 is turned on when the first control signal is activated. The second P-type transistor PT2 is turned on when the second control signal is activated. The first switch circuit 210 includes the first N-type transistor NT1 that is provided between the first power supply line L1 and the ground node and is turned on when the first control signal is deactivated. The second switch circuit 220 includes the second N-type transistor NT2 that is provided between the second power supply line L2 and the ground node and is turned on when the second control signal is deactivated. In this manner, when the first power supply voltage V1 is switched from the supply to the non-supply, an electric charge remaining in the first power supply line L1 can be discharged. Similarly, when the second power supply voltage V2 is switched from the supply to the non-supply, an electric charge remaining in the second power supply line L2 can be discharged.

Figure 9:
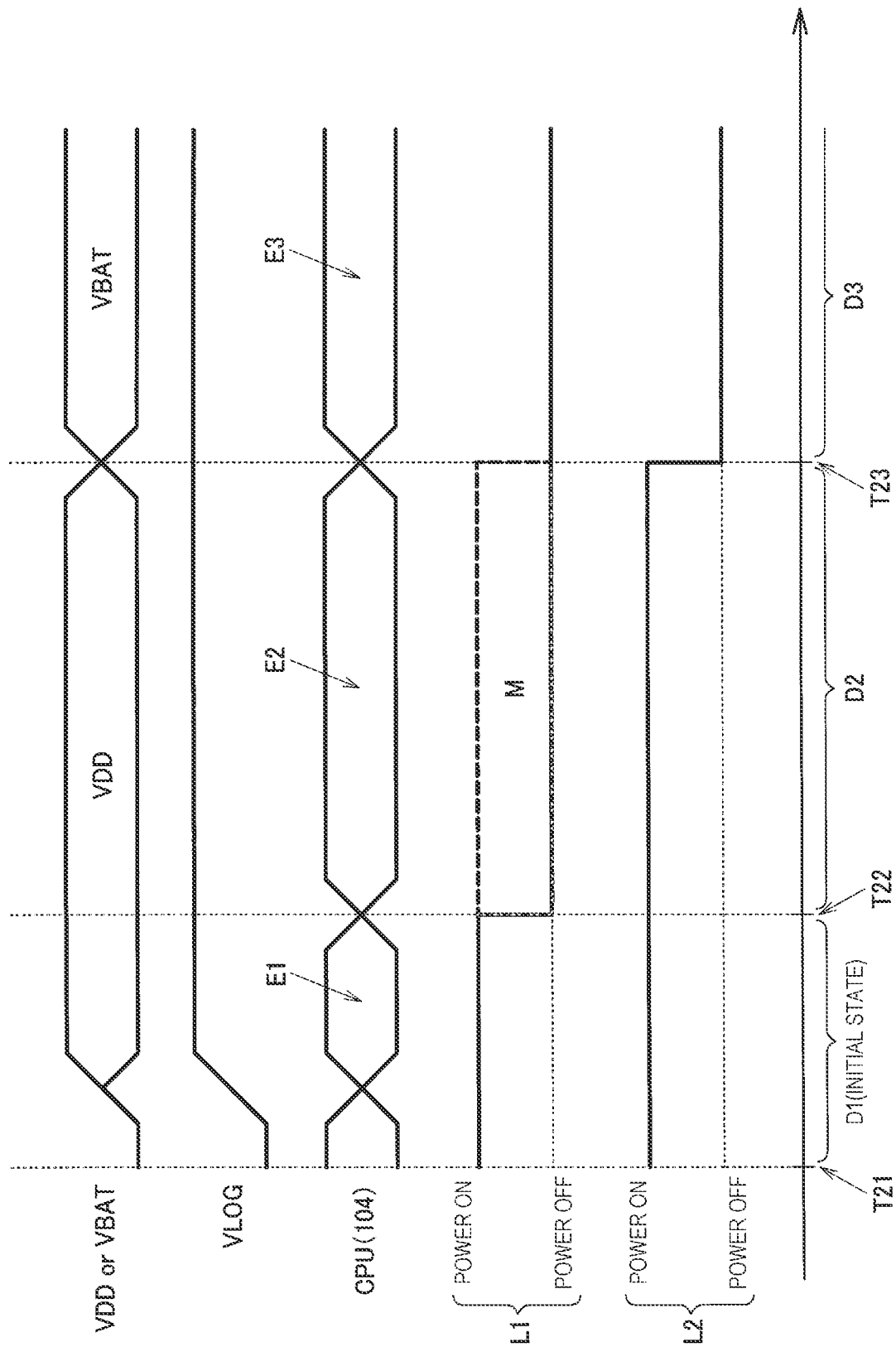
FIG. 9 is a time chart showing operations of the circuit device after an initial state.

FIG. 9 is a timing chart showing the operation of the circuit device 100 when incorporated in a program. At a timing T21, the external power supply and the circuit device 100 are coupled via the terminal TVDD, and the supply of the voltage VDD to the power supply circuit 130 is started. The voltage VLOG rises to correspond to a rise of the voltage VDD. The first power supply line L1 is in the power-on state, that is, a state where the first power supply voltage V1 can be supplied to the nonvolatile memory 110. Similarly, the second power supply line L2 is in the power-on state, that is, a state where the second power supply voltage V2 can be supplied to the volatile memory 120.

E1 in FIG. 9 shows a state where the CPU of the control circuit 104, which is operable by being supplied with the voltage VLOG, performs an initial operation. That is, a period from the timing T21 to a timing T22 is the initial state as indicated by D1. In the initial state, the CPU of the control circuit 104 performs, for example, an operation of copying program data stored in the nonvolatile memory 110 to the volatile memory 120 as a preparation operation for enabling execution of a program stored in the nonvolatile memory 110.

E2 in FIG. 9 shows a state where the CPU of the control circuit 104 executes a predetermined program. That is, during a period from the timing T22 to a timing T23, the CPU of the control circuit 104 performs the same operation as the normal state indicated by D2 in FIG. 4 according to a predetermined program. That is, the first power supply line L1 repeats the supply and the non-supply of the first power supply voltage V1 as indicated by M in FIG. 4. For example, the CPU of the control circuit 104 can implement repeating of on and off of the first switch circuit 210 and intermittent switching between the supply and the non-supply of the first power supply voltage V1 to the first power supply line L1 by repeating activation and deactivation of the first control signal described above with reference to FIG. 7 and the like. In other words, the CPU of the control circuit 104 controls the first switch circuit 210 to perform the intermittent switching operation. On the other hand, the CPU of the control circuit 104 performs control such that the state where the second power supply voltage V2 is supplied to the second power supply line L2 is continued from the timing T22 to the timing T23. This is because the second power supply voltage V2 needs to be supplied to the volatile memory 120 while the predetermined program is being executed. As described above, in the circuit device 100 according to the embodiment, in the initial period after power-on, the power supply switch circuit 200 supplies the first power supply voltage V1 to the first power supply line L1 and supplies the second power supply voltage V2 to the second power supply line L2. In a normal operation period after the initial period, the power supply switch circuit 200 performs the intermittent switching operation of intermittently switching the supply and the non-supply of the first power supply voltage V1 to the first power supply line L1 while supplying the second power supply voltage V2 to the second power supply line L2. In this manner, it is possible to appropriately set a period for performing the intermittent switching operation in a programmable manner.

E3 in FIG. 9 shows that the CPU of the control circuit 104 is in the sleep state. In other words, when the supply of the voltage VDD from the external power supply is switched to the supply of the voltage VBAT from the battery at the timing T23, the CPU of the control circuit 104 is in the sleep state indicated by D3 described above. That is, as described above with reference to FIG. 4, the CPU of the control circuit 104 performs control such that the first power supply voltage V1 is not supplied to the first power supply line L1 and the second power supply voltage V2 is not supplied to the second power supply line L2. More specifically, as described above with reference to FIG. 7 and the like, after the timing T23, the CPU of the control circuit 104 deactivates the first control signal and the second control signal to turn off the first P-type transistor PT1 and the second P-type transistor PT2, thereby turning off the first switch circuit 210 and the second switch circuit 220. As described above, in the circuit device 100 according to the embodiment, when a normal operation period (D2) is switched to a sleep operation period (D3), the power supply switch circuit 200 does not supply the first power supply voltage V1 to the first power supply line L1 and does not supply the second power supply voltage V2 to the second power supply line L2. In this manner, in the sleep state, it is possible to reduce the power consumption caused by the leakage current of the nonvolatile memory 110 and the volatile memory 120.

The above-described methods according to the embodiment may be appropriately combined. For example, the method of FIG. 5 and the method of FIG. 9 may be combined. That is, the control circuit 104 may use the above-described predetermined program as the temperature compensation program and perform control for the temperature compensation while the first power supply voltage V1 is supplied to the nonvolatile memory 110. As described above, in order to perform the temperature compensation, it is necessary to supply the first power supply voltage V1 to the nonvolatile memory 110, in other words, it is sufficient to supply the first power supply voltage V1 only during the period in which the temperature compensation is performed, and it is not necessary to always supply the first power supply voltage V1 to the nonvolatile memory 110. As described above, the circuit device 100 according to the embodiment includes the temperature compensated circuit 140 that performs the temperature compensation on the oscillation frequency of the oscillation circuit 102. The nonvolatile memory 110 stores the temperature compensation information used for the temperature compensation, and the temperature compensated circuit 140 performs the temperature compensation based on the temperature compensation information read from the nonvolatile memory 110 when the first power supply voltage V1 is supplied to the first power supply line L1 during the normal operation period. In this manner, it is possible to maintain the accuracy of the oscillation frequency and appropriately reduce the power consumption.

In addition, although illustration is omitted, the circuit device 100 according to the embodiment may perform a time synchronization process in combination with a positioning system of a global navigation satellite system (GNSS) such as a global positioning system (GPS). More specifically, for example, the control circuit 104 performs a process of converting a satellite signal received from a GPS satellite or the like to a desired digital signal by a specific method, a process of acquiring satellite time information based on the digital signal, and a process of rewriting a clock data generated by the clock circuit based on the satellite time information. Since the details of the configuration and the process necessary for the predetermined method are well known, the description thereof will be omitted. In this manner, it is possible to correct an error of the clock data generated during the sleep state indicated by D3 at the timing at which the sleep state is changed to the normal state indicated by D2 in FIGS. 4 and 9.

As described above, the circuit device according the embodiment includes an oscillation circuit, a control circuit, a first power supply line, a second power supply line, a nonvolatile memory, a volatile memory, and a power supply switch circuit. The oscillation circuit generates a clock signal by oscillating a resonator. The control circuit performs a real-time clock process based on the clock signal. The nonvolatile memory operates at a first power supply voltage from the first power supply line. The volatile memory operates at a second power supply voltage from the second power supply line. The power supply switch circuit performs control of switching between supply and non-supply of the first power supply voltage to the first power supply line and control of switching between supply and non-supply of the second power supply voltage to the second power supply line.

In this manner, it is possible to perform the appropriate power supply control on the nonvolatile memory and the volatile memory. For example, in a situation where allowable power consumption is limited and the voltage supply to the nonvolatile memory is not necessary, when non-supply of a voltage to the first power supply line is possible, the voltage can be supplied to other modules.

In a first state, the power supply switch circuit may supply the first power supply voltage to the first power supply line and supply the second power supply voltage to the second power supply line. In a second state, the power supply switch circuit may not supply the first power supply voltage to the first power supply line and supply the second power supply voltage to the second power supply line. In a third state, the power supply switch circuit may not supply the first power supply voltage to the first power supply line and not supply the second power supply voltage to the second power supply line.

In this manner, a magnitude of a leakage current can be changed according to a desired state.

The power supply switch circuit may perform an intermittent operation on the supply of the first power supply voltage to the first power supply line by alternately switching between the first state and the second state.

In this manner, the nonvolatile memory can be operated only in a desired period.

The power supply switch circuit may be set to the third state during a sleep operation period of the circuit device.

In this manner, a period during which the control circuit is operated and the sleep operation period can be freely set.

The circuit device may include a temperature compensated circuit that performs temperature compensation on an oscillation frequency of the oscillation circuit, and the nonvolatile memory may store temperature compensation information used for the temperature compensation.

In this manner, it is possible to obtain a highly accurate oscillation frequency from the resonator while controlling the power consumption.

The volatile memory may store program data for operating the control circuit.

In this manner, the control circuit can control the power supply switch circuit in a programmable manner.

The power supply switch circuit may include a first switch circuit that switches between the supply and the non-supply of the first power supply voltage to the first power supply line, and a second switch circuit that switches between the supply and the non-supply of the second power supply voltage to the second power supply line.

In this manner, it is possible to switch between supply and non-supply of voltages of different magnitudes to the nonvolatile memory and the volatile memory.

The first switch circuit may include a first P-type transistor that is provided between an input power supply voltage node and the first power supply line and is turned on or off based on the first control signal, and the second switch circuit may include a second P-type transistor that is provided between the input power supply voltage node and the second power supply line and is turned on or off based on the second control signal.

In this manner, it is possible to provide the power supply switch circuit that independently controls the first power supply line and the second power supply line using the P-type transistor.

The first P-type transistor may be turned on when the first control signal is activated. The second P-type transistor may be turned on when the second control signal is activated. The first switch circuit may include a first N-type transistor that is provided between the first power supply line and a ground node and is turned on when the first control signal is deactivated. The second switch circuit may include a second N-type transistor that is provided between the second power supply line and the ground node and is turned on when the second control signal is deactivated.

In this manner, when the first power supply voltage is switched from the supply to the non-supply, an electric charge remaining in the first power supply line can be discharged. Similarly, when the second power supply voltage is switched from the supply to the non-supply, an electric charge remaining in the second power supply line can be discharged.

In an initial period after power-on, the power supply switch circuit may supply the first power supply voltage to the first power supply line and supply the second power supply voltage to the second power supply line. In a normal operation period after the initial period, the power supply switch circuit may perform an intermittent switching operation of intermittently switching the supply and the non-supply of the first power supply voltage to the first power supply line while supplying the second power supply voltage to the second power supply line.

In this manner, it is possible to appropriately set a period for performing the intermittent switching operation in a programmable manner.

When the normal operation period is switched to the sleep operation period, the power supply switch circuit may not supply the first power supply voltage to the first power supply line and not supply the second power supply voltage to the second power supply line.

In this manner, in the sleep state, it is possible to reduce the power consumption due to the leakage current of the nonvolatile memory and the volatile memory.

The circuit device may include a temperature compensated circuit that performs temperature compensation on an oscillation frequency of the oscillation circuit, and the nonvolatile memory may store temperature compensation information used for the temperature compensation. The temperature compensated circuit may perform the temperature compensation based on the temperature compensation information read from the nonvolatile memory when the first power supply voltage is supplied to the first power supply line during the normal operation period.

In this manner, it is possible to maintain the accuracy of the oscillation frequency and appropriately reduce the power consumption.

The control circuit may operate based on an input power supply voltage, and independently control a state where the power supply switch circuit supplies the input power supply voltage to the first power supply line as the first power supply voltage and a state where the power supply switch circuit supplies the input power supply voltage to the second power supply line as the second power supply voltage.

In this manner, it is possible to supply voltages having different magnitudes to the nonvolatile memory and the volatile memory, respectively, and to switch between the supply and the non-supply of voltages to the nonvolatile memory and the volatile memory by the single input power supply voltage.

An oscillator according to the embodiment includes the above-described circuit device and the resonator.

Although the embodiment has been described in detail above, it will be easily understood by those skilled in the art that many modifications can be made without substantially departing from the novel matters and effects according to the present disclosure. Accordingly, such modifications are intended to be in the scope of the present disclosure. For example, a term described at least once together with a different term having a broader meaning or the same meaning in the description or the drawings can be replaced with the different term in any place in the description or the drawings. All combinations of the embodiment and the modifications are also included in the scope of the present disclosure. Further, the configurations, operations, and the like of the circuit device, the oscillator, and the like are not limited to those described in the embodiment, and various modifications can be made.

What is claimed is:

1. A circuit device comprising:
   an oscillation circuit configured to generate a clock signal by oscillating a resonator;
   a control circuit configured to perform a real-time clock process based on the clock signal;
   a first power supply line;
   a second power supply line;
   a nonvolatile memory configured to operate at a first power supply voltage from the first power supply line;
   a volatile memory configured to operate at a second power supply voltage from the second power supply line; and
   a power supply switch circuit configured to perform control of switching between supply and non-supply of the first power supply voltage to the first power supply line and control of switching between supply and non-supply of the second power supply voltage to the second power supply line.

2. The circuit device according to claim 1, wherein
   the power supply switch circuit
   supplies the first power supply voltage to the first power supply line and supplies the second power supply voltage to the second power supply line in a first state,
   does not supply the first power supply voltage to the first power supply line and supplies the second power supply voltage to the second power supply line in a second state, and
   does not supply the first power supply voltage to the first power supply line and does not supply the second power supply voltage to the second power supply line in a third state.

3. The circuit device according to claim 2, wherein
   the power supply switch circuit performs an intermittent operation on the supply of the first power supply voltage to the first power supply line by alternately switching between the first state and the second state.

4. The circuit device according to claim 2, wherein
   the power supply switch circuit is set to the third state during a sleep operation period of the circuit device.

5. The circuit device according to claim 1, further comprising:
   a temperature compensated circuit configured to perform temperature compensation on an oscillation frequency of the oscillation circuit, wherein
   the nonvolatile memory stores temperature compensation information used for the temperature compensation.

6. The circuit device according to claim 1, wherein
   the volatile memory stores program data for operating the control circuit.

7. The circuit device according to claim 1, wherein
   the power supply switch circuit includes
   a first switch circuit configured to switch between the supply and the non-supply of the first power supply voltage to the first power supply line, and
   a second switch circuit configured to switch between the supply and the non-supply of the second power supply voltage to the second power supply line.

8. The circuit device according to claim 7, wherein
   the first switch circuit includes a first P-type transistor provided between an input power supply voltage node and the first power supply line and turned on or off based on a first control signal, and
   the second switch circuit includes a second P-type transistor provided between the input power supply voltage node and the second power supply line and turned on or off based on a second control signal.

9. The circuit device according to claim 8, wherein
the first P-type transistor is turned on when the first control signal is activated,
the second P-type transistor is turned on when the second control signal is activated,
the first switch circuit includes a first N-type transistor provided between the first power supply line and a ground node and turned on when the first control signal is deactivated, and
the second switch circuit includes a second N-type transistor provided between the second power supply line and the ground node and turned on when the second control signal is deactivated.

10. The circuit device according to claim 1, wherein
the power supply switch circuit
supplies the first power supply voltage to the first power supply line and supplies the second power supply voltage to the second power supply line in an initial period after power-on, and
performs an intermittent switching operation of intermittently switching the supply and the non-supply of the first power supply voltage to the first power supply line while supplying the second power supply voltage to the second power supply line in a normal operation period after the initial period.

11. The circuit device according to claim 10, wherein
the power supply switch circuit does not supply the first power supply voltage to the first power supply line and does not supply the second power supply voltage to the second power supply line when the normal operation period is switched to a sleep operation period.

12. The circuit device according to claim 10, further comprising:
a temperature compensated circuit configured to perform temperature compensation on an oscillation frequency of the oscillation circuit, wherein
the nonvolatile memory stores temperature compensation information used for the temperature compensation, and
the temperature compensated circuit performs the temperature compensation based on the temperature compensation information read from the nonvolatile memory when the first power supply voltage is supplied to the first power supply line during the normal operation period.

13. The circuit device according to claim 1, wherein
the control circuit operates based on an input power supply voltage, and independently controls a state where the power supply switch circuit supplies the input power supply voltage to the first power supply line as the first power supply voltage and a state where the power supply switch circuit supplies the input power supply voltage to the second power supply line as the second power supply voltage.

14. An oscillator comprising:
the circuit device according to claim 1; and
the resonator.

* * * * *